(12) United States Patent
Semkow et al.

(10) Patent No.: US 6,501,174 B2
(45) Date of Patent: Dec. 31, 2002

(54) INTERCONNECT STRUCTURE FOR SURFACE MOUNTED DEVICES

(75) Inventors: Krystyna W. Semkow, Poughquag, NY (US); Edward R. Pillai, Wappingers Falls, NY (US); Linda L. Rapp, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/765,025

(22) Filed: Jan. 17, 2001

(65) Prior Publication Data

US 2002/0130410 A1 Sep. 19, 2002

(51) Int. Cl.⁷ .......................... H01L 23/34; H01L 23/48
(52) U.S. Cl. .................. 257/724; 257/723; 257/737; 257/778
(58) Field of Search .................. 257/723, 724, 257/734, 735, 736, 737, 738, 739, 777, 778, 780, 784, 786; 438/107, 109, 110; 361/767, 770, 772, 777, 778

(56) References Cited

U.S. PATENT DOCUMENTS 5,468,997 A * 11/1995 Imai et al. ................... 257/734
5,652,466 A * 7/1997 Hirakawa et al. ............ 257/772

FOREIGN PATENT DOCUMENTS

JP          4-62961        *   2/1992

* cited by examiner

*Primary Examiner*—Tom Thomas
*Assistant Examiner*—Hung Kim Vu
(74) *Attorney, Agent, or Firm*—Tiffany L. Townsend

(57) ABSTRACT

A semiconductor interconnect connection mechanism for attaching individual surface mounted semiconductor objects to multichip products whereby at least a portion of the electrical pathway between different objects on the top surface of surface mounted devices is not located on the top surface.

12 Claims, 4 Drawing Sheets

INTERCONNECT STRUCTURE FOR SURFACE MOUNTED DEVICES

FIELD OF INVENTION

This invention is directed to the field of semiconductor assembly packaging generally and the attachment of individual chips to multichip products specifically.

BACKGROUND OF THE INVENTION

Those in the semiconductor industry face a never ending effort to increase productivity and decrease the size of computer products. As the size of overall packages decreases so does the size of the individual chips that form the overall package. Conversely, the efficiency and power of the overall packages increase with each generation. Each generation faces different challenges introduced by shrinking size and changing processes.

Currently one of the challenges exists on the chip interconnect level. Individual chips must be connected to each other and/or top surface electrical components, like resistors and capacitors. As the overall individual chip size decreases, so does the size of the interconnecting components. Individual chips on an overall package are usually connected the overall package by means of a solder connection. The solder connections, usually solder bumps correspond to interconnect structures on the package.

The amount of solder in a C4 (control collapsed chip connection) or solder bump forming each discrete solder bump must correspond to the pitch of the chip and also to the corresponding interconnect structure pad. There must be sufficient amounts of solder present to ensure electrical connection of an individual chip and long term reliability. As the size of the individual chip decreases so does the total area of the chip available for interconnecting in general and the area of an individual solder bump specifically. As a consequence, the chance of solder bleed out increases as solder bump size decreases.

Solder bleed out occurs where there is solder wetting in a location other than the desired location of the solder fillet. That is, the solder intended to create an electrical connection is misdirected due to the influence of other factors. One of the ways that solder bleeding can occur is where the solder can wet and spread onto a line connected to a C4 pad during chip joining causing low solder volume in the C4 joint. Low solder volume can cause reliability problems.

Current technology solder C4s can comprise low melting point lead/tin alloys. An example of a low melting point solder is a 37/63 eutectic solder. A typical corresponding structure pad can comprise copper or a copper alloy and is plated. Common plating materials or combinations of materials include nickel, phospate and gold. The most common material to bleed out is gold. Where gold bleed out is a problem some semiconductor designers have reengineered the shape of the pads to minimize the amount of gold necessary to ensure electrical connection. Other designers have tried other approaches including solder dams and laser ablation.

Thus there remains a need for an interconnect method that minimizes the risk of solder bleedout, ensures electrical connection and is reliable.

SUMMARY OF THE INVENTION

It is therefore an object of the invention to provide an interconnect mechanism that minimizes the risk of solder bleed out.

It is also an object of the instant invention to provide an interconnect structure that maintains electrical integrity.

The above and other objects and advantages, which will be apparent to one of skill in the art, are achieved in the present invention which is directed to A semiconductor interconnecting mechanism, comprising:

An interconnect structure having a top surface and a body, the top surface containing at least one discrete structure capable of electrically communicating with an discrete object;

At least one top surface electrical metallurgy disposed on the top surface of the interconnect structure, wherein said top surface electrical metallurgy is not in physical contact with any of the at least one discrete structures;

An interconnect spacer, having a line portion and two via portions, the line portion having two ends and each of the via portions having two ends, wherein the line portion is disposed within the body of the interconnect structure and wherein one of each of the via portion ends is in physical contact with one of the ends of the line portion, and wherein one of the two via ends not in contact with the line portion is in physical contact with one of the electrical metallurgy and the other of the two via ends not in contact with the line portion is in electrical communication with one of the at least one discrete structures.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE PREFERRED EMBODIMENTS

Figure 1:
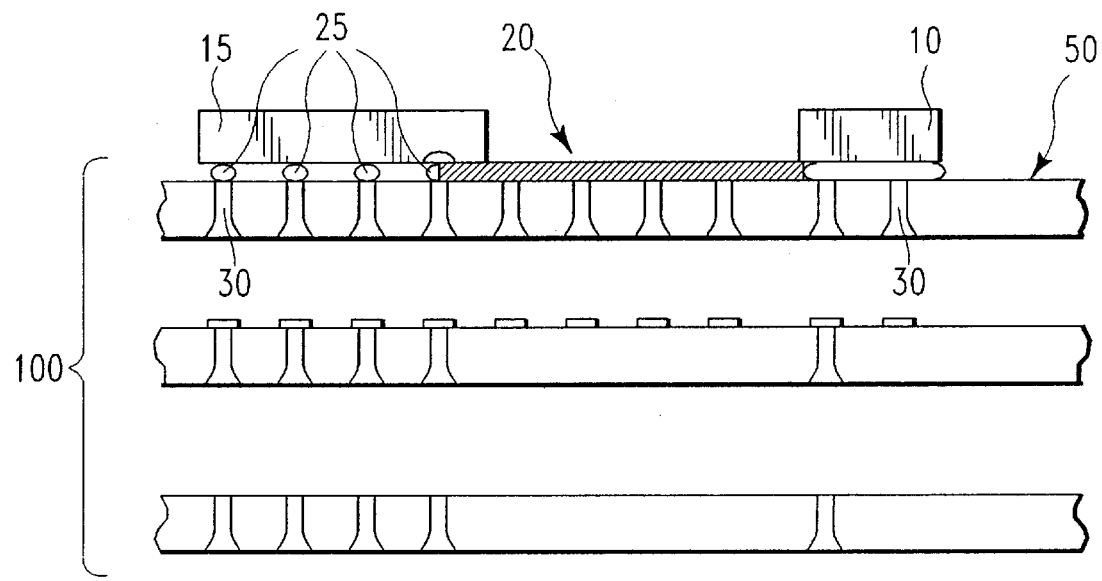
FIG. 1 is a prior art drawing for the instant invention.

Surface mount technology offers a way to connect devices such as resistors and capacitors to a chip by soldering a device to a pad on a surface of a substrate. Device to individual chip connections are preferably achieved by placing a conduction line between the device and a C4 pad on a substrate. A conduction line must not substantially impact the impedance requirements for a device. Going now to the figures generally which are not drawn to scale and are intended as a way to illustrate the invention only, FIG. 1 shows an example of a common configuration of an overall package containing discrete individual chips thereon. As shown in FIG. 1, a device, 10, is available to be connected to an individual chip, 15, located on the surface, 50, of the overall package, 100. Each individual chip 15, has the ability to be electrically connected to overall package by way of objects, 25. Generally, the electrically conductive interconnecting line, 20, contains metals. Specifically, the electrically conductive interconnecting line contains copper or a copper alloy. Generally, the objects, 25 will be discrete units of tin containing alloys. In a preferred embodiment, the objects would be lead/tin or tin/silver or tin/silver/copper solder. In a preferred embodiment, the objects would comprise solder containing C4s which would correspond to C4 pads on the overall package, 100. Stanchions, 30, located throughout the different layers of the overall package have multiple functions. Where necessary they can facilitate the electrical communication of the individual chips, 15, and the overall package, 100. In other cases the stanchions can be a portion of the support creating the overall mechanical integrity of package, 100.

A common, prior art, method of affecting the connection between devices and the individual chips can be seen in FIG. 1. As can be seen in FIG. 1, the electrical metallurgy, an interconnecting line 20, makes direct contact with the object affecting the electrical connection of the individual chip with the overall package, 25. Generally, the interconnecting line 20, contains a metal, copper and copper alloys are common materials/conductors used for certain package types, like glass ceramic packages. As discussed supra, this method can lead to solder bleed out. As the size of individual chips decreases and the amount of solder used to create the connections to the underlying package decreases proportionally, a solder bleed out may cause a reliability problem.

Figure 2:
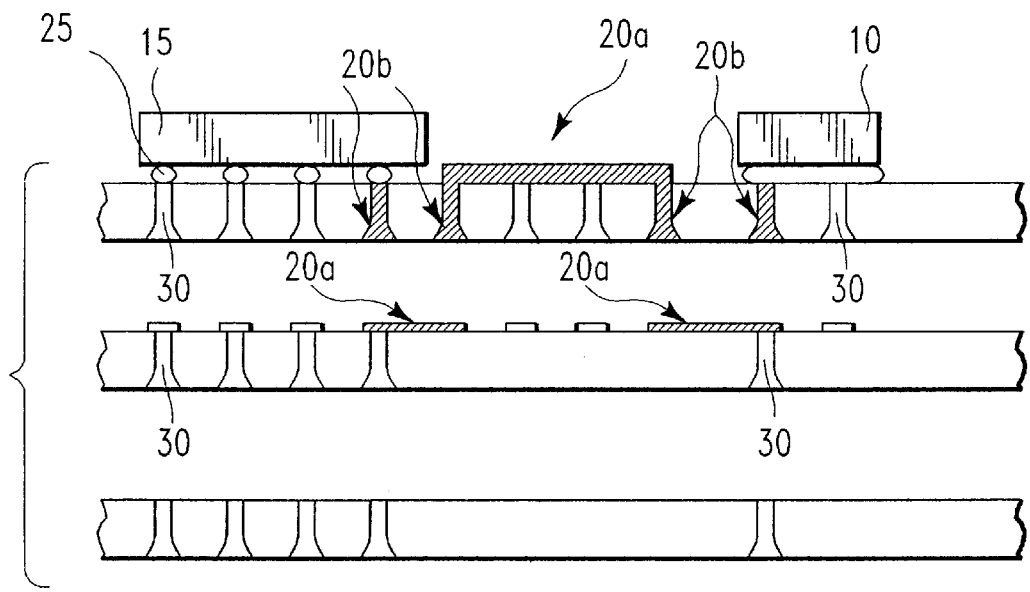
FIG. 2 is is a cross-sectional view showing one embodiment of the instant invention.

In the instant invention, one embodiment of which is shown in FIG. 2, at least a portion of the electrical metallurgy, the interconnecting line, 20, is positioned in a level below the top surface. In the example, the portion of the line, 20 displaced by the interconnect spacer is shown by 20a and 20b where 20a is the line portion and 20b is the via portion. For the purposes of the instant invention, the only portion of the line that must not be at the surface is the portion of the line that would contact the C4 of the individual chip and/or device. Regardless of the configuration of the interconnecting line, 20, it must be capable of electrically connecting the devices and the individual chips, 15. Intuitively, there must be vias disposed in the levels below the top surface, 50. The creation and filling of the vias and lines does not require additional processing steps as each level below the top surface is already patterned and filled to meet some other need of the package designer. The line and vias would be formed during the conventional processing of the overall package and would not require any additional processing steps. The instant invention might necessitate the use of different screens and/or masks to facilitate the depositing of the line and via fillers in the appropriate places.

There are many different types of materials that can form the package, 100. For purposes of illustration only, the instant example will assume that the package is comprised of a glass ceramic material. The package could also be made of material suitable for the purposes. A non-exhaustive list of materials includes:

TABLE I

| Material | Dieletric Constant |
|---|---|
| Polyimide | 3.2–3.5 |
| Glass Ceramic | 5.0–5.4 |
| Alumina Ceramic | 9.2–9.8 |
| Teflon | 2.2 |
| Teflon/Glass composite | 2.7–3.3 |
| Beurocyclobutene | 2.6 |
| FR4 | 4–4.7 |

Figure 3:
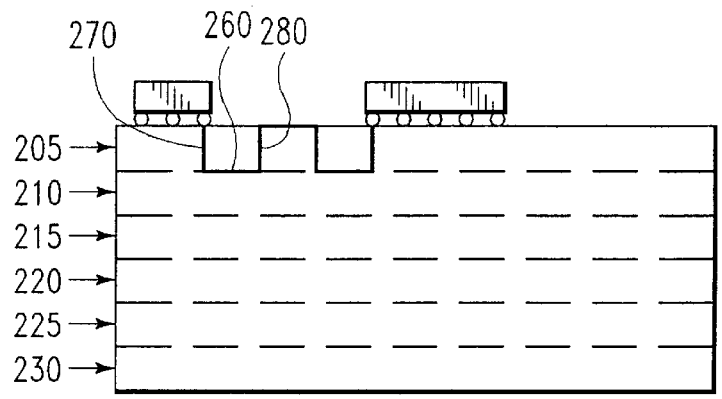
FIG. 3 is a cross sectional view showing another aspect of the instant invention.

It is also possible that the package could be composed of layers of dissimilar but compatible materials. An example of an alternate configuration of a package is given in FIG. 3. The package is composed of discrete levels of glass ceramics. Each level would have its own particular function. For example, there would be a level to facilitate individual chip attach, 205. A level to supply power to the individual chips 210 and 225. There would also be a level which would provide a signal, 215, for the redistribution of signal interconnects. Also, there would be a level that would form a ground for the individual chips. Additional or fewer levels, or even a single level, could be present depending on the needs of the chip designer.

Where the uppermost level, 205, is present to facilitate chip attach, as is the case in most instances, there would be portions of the level, 205, not involved in chip attach that would remain unused, 250. This space, 250, would be utilized with the instant invention. Vias, 270, 280, extending at least a portion of the way through the uppermost layer, 205, would connect to lines, 260 disposed on that uppermost layer, 250. The vias, 270, 280, may or may not coincide with the stanchions, 30, (not shown) discussed supra. Both of the vias, 270, 280 would terminate at the top surface, 50. One of the vias would terminate on the top surface under an individual chip and would be electrically connected to the package, 100, C4 pads (not shown). The other via would terminate on a portion of the top surface containing a top surface line. It is an element of the instant invention that the top surface line would not be in contact with the individual chip being electrically connected to the device. According to the instant invention, the top surface line may or may not be directly connected to a device. The vias would be connected by a line disposed in the level as stated previously.

Figure 4:
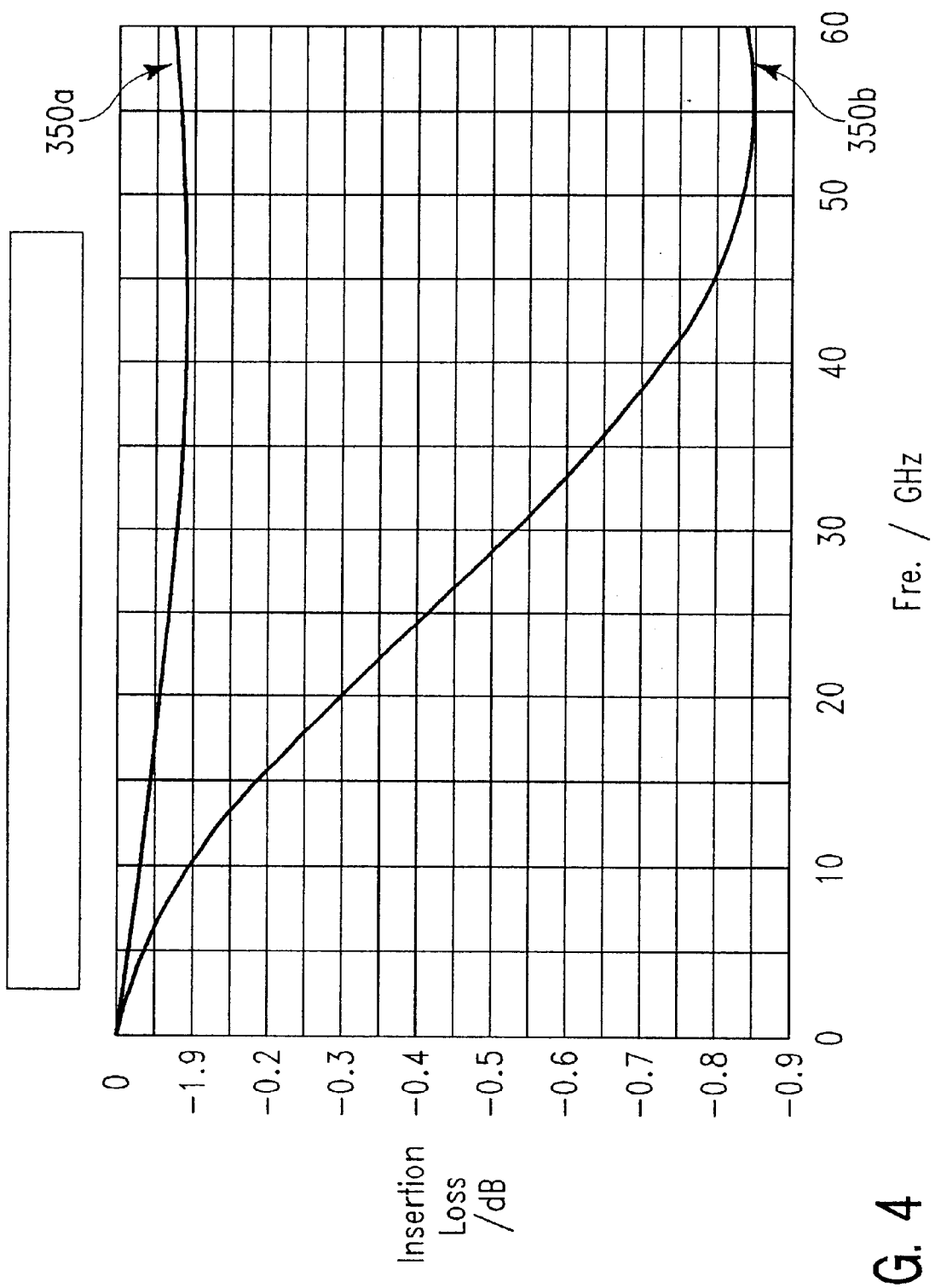
FIGS. 4 and 5 are graphs showing different electrical properties of the instant invention.
Figure 5:
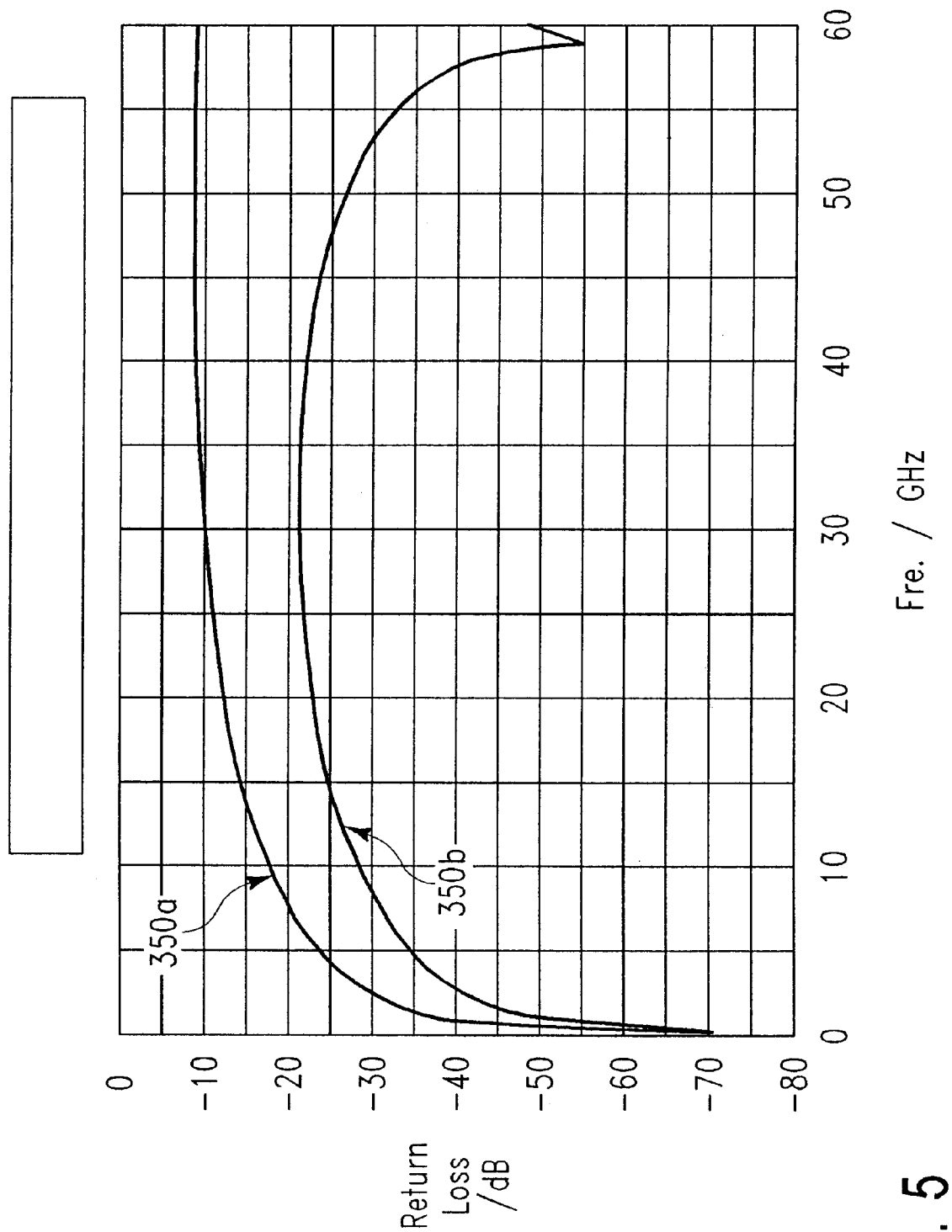

In addition to eliminating the possibility of solder bleed-out the instant invention reduces insertion loss and return loss significantly as shown in FIGS. 4 and 5. In both of FIGS. 4 and 5, the prior art method where substantially all of the interconnecting line, 20, is on the surface of the overall package is denoted as 350a and the object of the instant invention where at least the portion of the interconnecting line, 20, in contact with the devices and individual chips is not on the top surface is denoted at 350b. Insertion loss defines the amount of power dissipated in an electrical network. The amount of power dissipated is quantified as the difference between the power injected into and exiting a network. Return loss is the amount of power being reflected from an electrical network. The return loss is the ratio of the reflected power to the injected (incident) power.

There are tradeoffs when using the instant invention. It would not be feasible electrically to have the vias 270, 280 or the line, 260 be too long (see FIG. 3). The limitations on the lengths of the via and lines is a function of the material they will be travelling through and the frequency requirements of the overall package system. The lines and vias can be comprised of any electrically conductive material but in a preferred embodiment the package would be comprised of a glass ceramic. The line would be filled with a metal paste comprised of copper or copper/nickel or copper/glass, and optionally nickel, most preferably a paste containing 55.5% copper and 45.5% glass. Examples of materials that can comprise the via are copper or a nickel containing copper paste, examples of suitable pastes include pastes containing 55.5% copper and 45.5% glass, pastes containing 90% copper and 10% nickel, and pastes containing 40% copper and 60% glass.

The limitations on the line and via can be calculated once the package material is known. The feasibility of a proposed line/via length where the length of the line is a, and the length of the via is b, can be given by the equations below:

$$a \leq \lambda/10$$

$$b \leq \lambda/10$$

$$f = \frac{c}{\lambda\sqrt{\varepsilon r}}$$

Where $\lambda$ is the wavelength of the signal

Where C is the speed of light, $\varepsilon r$ is the dielectric constant of the package material and $f$ is the signal frequency. The usability of the structure electrically with respect to signal frequency is determined by the physical dimensions as related to the wavelength of the signal. It is accepted that the dimension of a nonuniformity in geometry would be determined by the three equations above. As an example, where the semiconductor package designer wants a=90 um and b=225 um. In a glass ceramic having a of 5, the length of the line, 225 um would reflect the limiting length. Where the greater of the line and via length is 225 um, the maximum frequency fmax is 59.6 GHz. Thus, where the semiconductor package designer requires a maximum frequency of greater than that calculate, some factor will have to be changed. For example, the limiting length might have to be shortened. Alternatively, the designer could choose a material with a different dielectric constant.

Figure 6A:
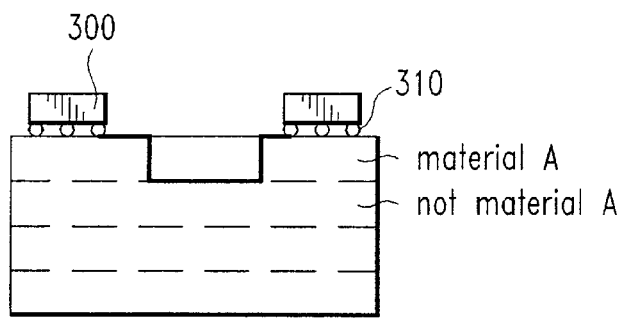
FIGS. 6a–c show three alternate configurations contemplated by the instant invention.
Figure 6B:
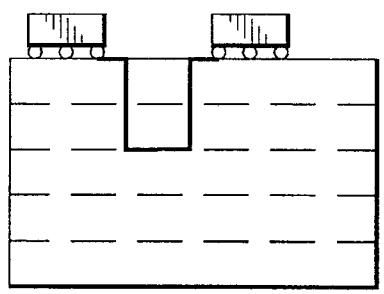
Figure 6C:
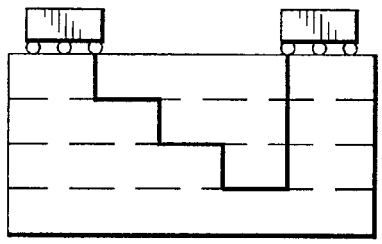

In an alternate embodiment, where the overall package was multilayered, the designer would select the material that would form the levels such that the frequency of the line would be maximized, regardless of the constituents of the other layers of the package. The material for the line level would of course have to be compatible with the material forming the other levels. Additionally, there are many configurations for the interconnect spacers. Representative examples are shown in FIGS. 6a–6c. In each instance the interconnect spacer is shown as a bolded black line, a device, 300 and an individual chip, 310.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A semiconductor interconnecting mechanism:
    an interconnect structure having a top surface and a body, the top surface containing a first discrete structure capable of electrically communicating with a second discrete structure;
    at least one top surface electrical metallurgy disposed on the top surface of the interconnect structure, said at least one top surface metallurgy having two ends, wherein said at least one top surface electrical metallurgy is not in physical contact with any of the first and second discrete structures;
    an interconnect spacer located in the body of the interconnect structure, the interconnect spacer having a first and second section, the first section having a line portion and a first and second via portion, one end of the interconnect spacer first section first via portion in physical contact with one of the two ends of the interconnect spacer first section line portion, the other end of the interconnect spacer first section first via portion in physical contact with one of the first and second discrete structures and wherein one end of the interconnect spacer first section second via portion is in physical contact with the other of the two ends of the interconnect spacer first section line portion, the other end of the interconnect spacer first section second via portion in electrical communication with the top surface metallurgy; and the interconnect spacer second section, having a line portion and a first and second via portion, one end of the interconnect spacer second section first via portion in physical contact with one of the two ends of the interconnect spacer second section line portion, the other end of the interconnect spacer second section first via portion in physical contact with the other of the first and second discrete structures and wherein one end of the interconnect spacer second section second via portion is in physical contact with the other of the two ends of the interconnect spacer second section line portion, the other end of the interconnect spacer second section second via portion in electrical communication with the top surface metallurgy.

2. The mechanism of claim 1 wherein the interconnect spacer comprises a copper containing paste.

3. The mechanism of claim 1 wherein at least one of the first and second discrete structures comprises an interconnection bonding pad.

4. The mechanism of claim 3 wherein at least one of the of the first and second discrete structures comprises a member selected from the group of surface mounted capacitors and resistors.

5. The mechanism of claim 1 wherein at least one of the first and second discrete structures comprises a member selected from the group of surface mounted capacitors and resistors.

6. The mechanism of claim 1 wherein the top surface electrical metallurgy comprises an electrically conductive paste.

7. The mechanism of claim 1 wherein the limiting frequency of the spacer is less than a predetermined maximum.

8. The mechanism of claim 1 wherein the top surface of the interconnect structure and at least a portion of the body are comprised of materials having non-identical dielectric constants.

9. The mechanism of claim 8 wherein the interconnect spacer first and second section line portions are disposed in a different material than the interconnect spacer first and second section via portions.

10. The mechanism of claim 8 wherein the line portion of the interconnect spacer is disposed in material comprising the body of the interconnect structure.

11. The mechanism of claim 10 wherein the material comprising the body of the interconnect structure is selected to minimize the dielectric constant.

12. The mechanism of claim 1 wherein the first and second section interconnect spacer line portions are comprised of a different material than the first and second section interconnect spacer via portions.

* * * * *